United States Patent [19]

Shii et al.

[11] 4,379,231
[45] Apr. 5, 1983

[54] ELECTRON MICROSCOPE

[75] Inventors: Kazuo Shii, Asahimura; Toshiyuki Ohashi, Katsuta, both of Japan

[73] Assignee: Hitachi, Ltd., Tokyo, Japan

[21] Appl. No.: 129,754

[22] Filed: Mar. 12, 1980

[30] Foreign Application Priority Data

Mar. 14, 1979 [JP] Japan .................. 54-28703

[51] Int. Cl.³ .......................................... G01N 23/00
[52] U.S. Cl. .................................................. 250/311
[58] Field of Search ................. 250/310, 311, 396 R, 250/396 ML, 397, 398

[56] References Cited

U.S. PATENT DOCUMENTS

| | | | |
|---|---|---|---|
| 2,886,727 | 5/1959 | Haine | 250/311 |
| 3,737,659 | 6/1973 | Yanaka et al. | 250/311 |
| 3,749,964 | 7/1973 | Hirata | 250/311 |
| 3,900,734 | 8/1975 | Kynaston et al. | 250/311 |
| 4,110,623 | 8/1978 | Azam et al. | 250/398 |
| 4,117,339 | 9/1978 | Wolfe | 250/398 |
| 4,162,403 | 7/1979 | Baumgarten | 250/311 |

*Primary Examiner*—Bruce C. Anderson
*Attorney, Agent, or Firm*—Craig and Antonelli

[57] ABSTRACT

An electron microscope is disclosed in which an electron beam impinges upon a specimen at a predetermined angle of incidence, the incident azimuth of the electron beam incident upon the specimen is continuously changed, and the electron beam having passed through the specimen is made large in angular spread by a magnifying lens system and then projected onto a viewing screen to form a visual enlarged image of the specimen on the viewing screen; and in which the astigmatism of the magnifying lens system is shown on the viewing screen as the blur of the image.

24 Claims, 2 Drawing Figures

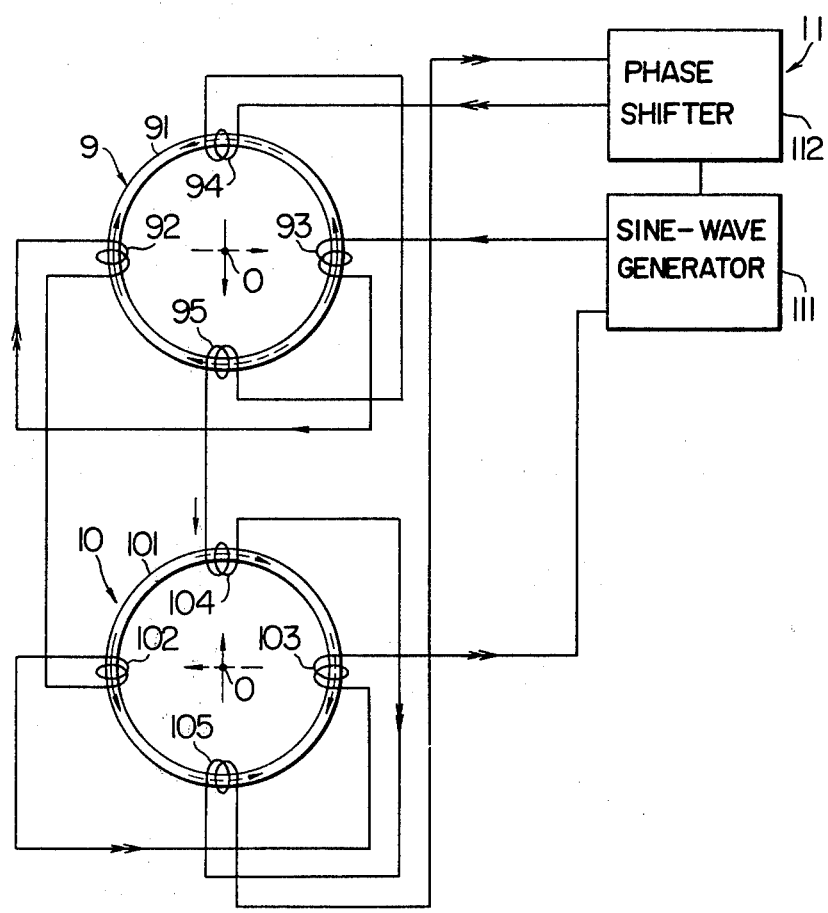

4,379,231

ELECTRON MICROSCOPE

BACKGROUND OF THE INVENTION

1. Field of the Invention

Ths present invention relates to an electron microscope, and more particularly to an electron microscope in which the astigmatism of the magnifying lens system can be readily confirmed.

2. Description of the Prior Art

In an electron microscope which irradiates a specimen with an electron beam and magnifies the electron beam which has passed through the specimen in angular spread to project an enlarged image of the specimen onto a viewing screen, the astigmatism of the imaging lens system, namely, the magnifying lens system exerts a great influence upon the resolving power of the electron microscope. Specifically, the astigmatism of the objective lens which has a large magnification is an important problem. Accordingly, in designing an electron microscope, a great effort is spent on avoiding astigmatism. However, it is extremely difficult to completely eliminate the astigmatism. Therefore, electron microscopes are usually provided with means for correcting astigmatism.

In order to correct astigmatism, the presence of astigmatism has to be confirmed, and the following Fresnel fringe method has been generally employed to confirm the presence of astigmatism. That is, when the image of a hole provided in a collodion film is observed on the viewing screen of the electron microscope, a Fresnel fringe is simultaneously observed which is generated due to electron diffraction in the periphery of the image of the hole. In this case, when the magnifying lens system produces an astigmatism, the width of the Fresnel fringe in the direction of astigmatism differs from that in the direction perpendicular to that of astigmatism. Accordingly, the presence of astigmatism can be confirmed by the difference in width of the Fresnel fringe formed on the viewing screen. Such a method for confirming the astigmatism is generally called the Fresnel fringe method.

In the Fresnel fringe method, however, it is required to compare the widths of the Fresnel fringe in the orthogonal directions, and to judge whether the widths are different from each other or not. Since the difference between the above widths is very small, it is very difficult to confirm the presence of astigmatism in this way. For example, when a hole in a collodion film was irradiated with an electron beam accelerated by a voltage of 50 KV, the Fresnel fringe in the periphery of the image of the hole had a maximum width of 40 Å in the direction of astigmatism and a minimum width of 35 Å in the direction perpendicular to that of astigmatism. These values were measured by a microphotometer. The result of calculation based upon the above values shows that the astigmatic spacing is equal to 0.2 μm. When a lens system having, for example, a magnification of $10^5$ is employed, a difference in width of the Fresnel fringe which is equal to 5 Å, is observed as a difference of 0.05 mm on the viewing screen. However, it is practically impossible to confirm by the naked eye the above difference of 0.05 mm in the orthogonal directions.

SUMMARY OF THE INVENTION

An object of the present invention is to provide an electron microscope in which a small astigmatism of the magnifying lens system can be readily confirmed.

Another object of the present invention is to provide an electron microscope in which a small astigmatism of the magnifying lens system can be confirmed even in a relatively small magnification range.

A further object of the present invention is to provide an electron microscope in which the astigmatism of the magnifying lens system can be confirmed without replacing a sample under observation by a predetermined one.

In order to attain the above objects, an electron microscope according to the present invention comprises means for generating an electron beam; means for causing the electron beam to impinge upon a specimen at a predetermined incident angle while continuously changing the incident azimuth of the electron beam incident upon the specimen to transmit the electron beam through the specimen; a magnifying lens system for magnifying the transmitted electron beam in angular spread; and a viewing fluorescent screen for receiving the magnified electron beam projected thereon to form a visual enlarged image of the specimen on the viewing fluorescent screen.

When the Z-coordinate axis of a three-dimensional rectangular coordinate system is taken as the direction of the electron beam, if astigmatism is present in the lens system, the electron beam does not converge with respect to the direction of the Y-coordinate axis at a point on the Z-coordinate axis where the electron beam can focus with respect to the direction of the X-coordinate axis, and further the electron beam does not converge with respect to the direction of the X-coordinate axis at another point on the Z-coordinate axis where the electron beam can focus with respect to the direction of the Y-coordinate axis. The previously-mentioned astigmatic spacing means the distance between the above-mentioned two points on the Z-coordinate axis. The blur or spread of the electron beam at these points is expressed on the viewing screen by $\alpha \cdot \Delta f \cdot M$, when the angle of incidence of the electron beam upon the specimen, the astigmatic spacing of the magnifying lens system and the magnification thereof are given by $\alpha$, $\Delta f$ and $M$, respectively. As is apparent from the above formula, a blur of the image appears so long as the astigmatism of the magnifying lens system, namely, the astigmatic spacing is present. A small astigmatism can be confirmed by intentionally enlarging the above blur. According to the present invention, since the incident azimuth of the electron beam incident upon the specimen is continuously changed, the electron beam can have a large angle of incidence for the specimen, and therefore the astigmatism can be confirmed in an enlarged form. In other words, in the case where the astigmatism is present, the astigmatism is observed on the viewing screen as the blur of an enlarged image. Since the amount of the above blur is far greater than the difference in width of the Fresnel fringe and the blur is generated in the direction of astigmatism, namely in a single direction, the method making use of the above blur can readily confirm even a small astigmatism undetectable by the Fresnel fringe method, in which the width of the Fresnel fringe in one direction has to be compared with that in another direction perpendicular to the one direction to confirm the presence of astigmatism.

Other objects, features and advantages of the present invention will be made apparent from the following description given in conjunction with the accompanying drawings.

BRIEF DESCRIPTION OF THE DRAWINGS

FIG. 2 is a schematic diagram for explaining the rotating field generator shown in FIG. 1.

DESCRIPTION OF THE PREFERRED EMBODIMENT

Figure 1:
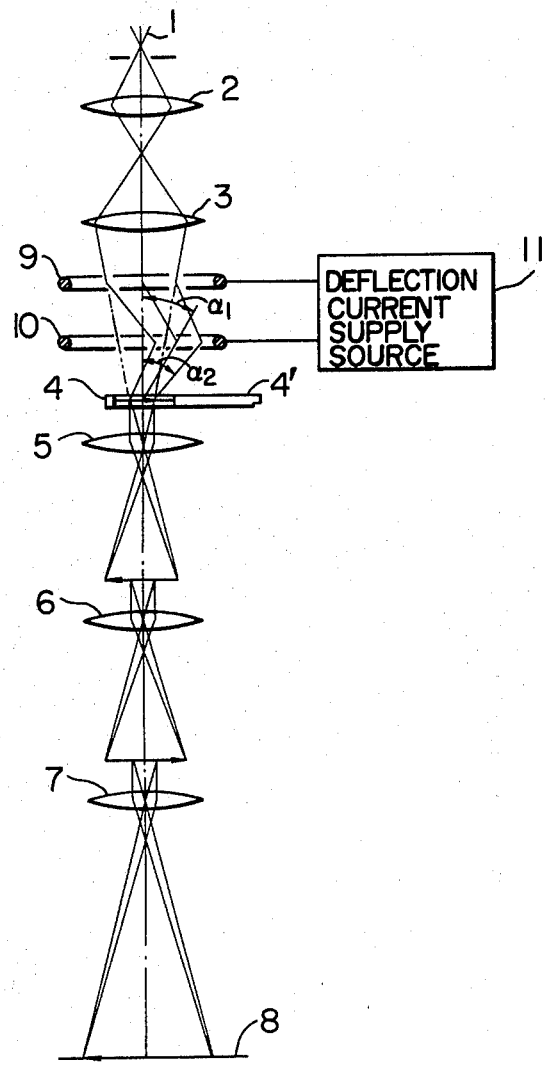
FIG. 1 is a schematic diagram showing an embodiment of an electron microscope according to the present invention.

Referring to FIG. 1, an electron beam emitted from an electron gun 1 is focussed on a specimen 4 supported by a specimen holder 4' by a focussing lens system made up of first and second focussing lenses 2 and 3, and impinges upon the specimen 4. The electron beam having passed through the specimen 4 is magnified in angular spread by an imaging lens system, namely, a magnifying lens system made up of an objective lens 5, an intermediate lens 6 and a projection lens 7, and is then projected onto a viewing screen 8 to form the image of the specimen 4 on the screen 8. The viewing screen 8 is formed of a fluorescent screen, and therefore the image of the specimen 4 can be observed on the screen 8 as a visual enlarged image. Between the second focussing lens 3 and the specimen 4 are disposed first and second deflectors 9 and 10 which are connected to a deflection current supply source 11. An apparatus made up of the first and second deflectors 9 and 10 and the supply source 11 are herein referred to as a rotating field generator. Referring to FIG. 2 which shows an embodiment of the rotating field generator, the first and second deflectors 9 and 10 are of the troidal type, namely, of an electromagnetic type. The first and second deflectors are provided respectively with ring-shaped cores 91 and 101 each with the center thereof on an axis 0 along which the electron beam travels. A pair of coils 92 and 93 are wound round the core 91 on the X-coordinate axis of a coordinate system having its origin on the axis 0 and a pair of coils 94 and 95 are wound round the core 91 on the Y-coordinate axis of the above coordinate system. Similarly, two pairs of coils are wound round the core 101. That is, a pair of coils 102 and 103 are wound round the core 101 on the X-coordinate axis of another coordinate system having its origin on the axis 0, and a pair of coils 104 and 105 are provided on the Y-coordinate axis of this coordinate system.

A pair of coils which are placed on the X-coordinate axis in each of the first and second deflectors are hereinafter referred to as an X-deflection system, and a pair of coils placed on the Y-coordinate axis in each of the deflectors are referred to as a Y-deflection system. The X- and Y-deflection systems are arranged at right angles. The solid lines each with an arrow on the core 91 indicates the direction of the magnetic flux which is generated in the core 91 by the X-deflection system, and the dotted lines each with an arrow on the core 91 shows the direction of the magnetic flux produced by the Y-deflection system. The solid and dotted lens each with an arrow on the core 101 have the same meanings as those on the core 91. Further, in the first deflector 9, a solid line with an arrow on the Y-coordinate axis and a dotted line with an arrow on the X-coordinate axis indicate the directions of magnetic fields produced respecively by the X-deflection system and the Y-deflection system. A solid line with an arrow and a dotted line with an arrow on the coordinate axes shown in the second deflector 10 have the same meanings as those in the first deflector 9.

The deflection current supply source 11 is made up of a sine-wave generator 111 for generating a sine-wave alternating current and a phase shifter 112 supplied with the sine-wave alternating current from the sine-wave generator 111 for generating another sine-wave alternating current shifted in phase from the supplied current by 90°. The amplitude and the frequency of the sine-wave alternating current generated by the generator 111 and those of the current generated by the phase-shifter 112 are varied in interlocking relationship with each other.

The coils 93, 92, 102 and 103, which make up the X-deflection system, are series-connected in the order described, and are further connected to the sine-wave generator 111 in such a manner that the sine-wave alternating current from the sine-wave generator 111 flows in the direction indicated by double arrows. Further, the coils 94, 95, 104 and 105, which make up the Y-deflection system, are series-connected in the order described, and are connected to the phase shifter 112 to pass the sine-wave alternating current through these coils in the direction indicated by double arrows.

As described above, the sine-wave alternating current from the sine-wave generator 111 passes through the coils 93, 92, 102 and 103, which form the X-deflection system, in the order described. Thus, the magnetic flux having the direction shown by the solid lines each with an arrow is generated in each of the cores 91 and 101 by the X-deflection system, and therefore a magnetic field is generated in the direction indicated by the solid line with an arrow on the Y-coordinate axis of the coordinate system with its origin on the axis 0. Further, the sine-wave alternating current from the phase shifter 112 passes through the coils 94, 95, 104 and 105, which make up the Y-deflection system, in the order described. Thus, the magnetic flux having the direction indicated by the dotted lines each with an arrow is generated in each of the cores 91 and 101, and therefore a magnetic field is generated in the direction indicated by the dotted line with an arrow on the X-coordinate axis of the coordinate system with its origin on the axis 0.

When the current produced by the sine-wave generator 111 is given by $I_1 \sin \omega t$, a magnetic field $H_y$ which is expressed by $H_1 \sin \omega t$ and is proportional to the current $I_1 \sin \omega t$, is produced in the first deflector 9 in the direction indicated by the solid line with an arrow on the above-mentioned Y-coordinate axis. Further, when the current produced by the phase shifter 112 is given by $I_1 \cos \omega t$ which is different in phase from the current $I_1 \sin \omega t$ by 90°, a magnetic field $H_x$ which is expressed by $H_1 \cos \omega t$ and is proportional to the current $I_1 \cos \omega t$, is generated in the first deflector 9 in the direction indicated by the dotted line with an arrow on the X-coordinate axis. Accordingly, the combined magnetic field H is equal to $H_1$ and therefore has a constant field strength. When an angle between the combined magnetic field H and the X-coordinate axis is given by $\theta$, the angle $\theta$ is equal to $\omega t$, and therefore the combined magnetic field is rotated at an angular velocity of $\omega$, that is, becomes a rotating field having a frequency of $f(=\omega/2\pi)$.

When the coils provided in the second deflector 10 are different in number of turns from the coils of the first deflector 9, a magnetic field $H_x$ expressed by $H_2 \cos \omega t$ and a magnetic field $H_y$ expressed by $H_2 \sin \omega t$ are generated by the second deflector 10 in the direction indicated by the dotted line with an arrow on the X-coordinate axis and in the direction indicated by the solid line with an arrow on the Y-coordinate axis, respectively. Accordingly, the combined magnetic field H is equal to $H_2$ and therefore has a constant field strength. The combined magnetic field $H_2$ becomes a rotating field having a frequency of $f(=\omega/2\pi)$, as in the case of the first deflector 9.

Now, explanation will be made on how the electron beam incident upon the specimen 4 is affected by the above rotating field, with reference to FIG. 1. The electron beam which is to impinge upon the specimen 4, is first deflected by the first deflector 9 in a direction, and then deflected by the second deflector 10 in the opposite direction. This is because the combined magnetic field generated by the first deflector 9 and that generated by the second deflector 10 are opposite in direction to each other.

In order to facilitate the understanding, let us consider a case where the coils of the first deflector 9 are equal in number of turns to each other, and the coils of the second deflector 10 are also equal in number of turns to each other, but the number of turns of each coil of the second deflector 10 is twice as large as that of each coil of the first deflector 9. Then, the deflection angle of the electron beam given by the second deflector 10 becomes twice as large as that of the electron beam given by the first deflector 9. When the second deflector 10 is disposed just half-way between the first deflector 9 and the specimen 4, the electron beam having been deflected by the first deflector 9 is restored by the second deflector 10 to a portion of the specimen 4, on which the electron beam impinges in the case that the first and second deflectors are not employed. In other words, the electron beam impinges upon the specimen 4 at an angle of incidence. However, since the combined magnetic field generated by the first deflector 9 and that generated by the second deflector 10 are rotated in interlocking relationship with each other and moreover are opposite in direction to each other, the incident azimuth of the electron beam as it impinges upon the specimen 4 is continuously changed.

Therefore, when the astigmatism is present in the magnifying lens system, the astigmatism can be observed on the viewing screen as the blur of an image in the direction of astigmatism. In more detail, the above blur of the image is proportional to the incident angle $\alpha_2$ of the electron beam upon the specimen 4, and therefore the astigmatism can be confirmed in the form of the blur of an enlarged image even in a case where the astigmatism of the magnifying lens system is small.

For example, in a case where the incident angle $\alpha_2$ of the electron beam incident upon the specimen 4 and the magnification M are equal respectively to 4° (or 0.07 rad.) and $10^5$, the astigmatism expressed by the astigmatic spacing $\Delta f$ having a value of 0.2 $\mu$m is observed on the viewing screen 8 as a blur of the image of 1.4 mm. This value is 28 times as large as 0.05 mm obtained by the Fresnel fringe method. Even in a case where the incident angle $\alpha_2$ of the electron beam is equal to 1°, the blur of image observed on the viewing screen 8 is equal to 0.35 mm, which is 7 times as large as 0.05 mm obtained by the Fresnel fringe method.

Incidentally, in conventional electron microscopes which are not provided with the rotating field, the incident angle of the electron beam incident upon the specimen is of the order of $10^{-3}$ rad, and therefore the blur of image observed on the viewing screen is equal to one seventieth of the above-mentioned value 1.4 mm, or to one eighteenth of the value 0.35 mm.

Since the astigmatism of the magnifying lens system is observed on the viewing screen 8 as the blur of an image and moreover the blur takes place only in the direction of astigmatism, namely, in a single direction, the small astigmatism which cannot be detected by the Fresnel fringe method, is readily confirmed by the present invention.

Further, the fact that even the small astigmatism can be confirmed, means that the confirmation of the astigmatism can be made at a low magnification of the magnifying lens system. According to the Fresnel fringe method, an astigmatic spacing of 0.2 $\mu$m produces a difference of 0.05 mm between the widths of the Fresnel fringe on the viewing screen, at a magnification of $10^5$. According to the present invention, a blur of image of 0.05 mm on the viewing screen 8 which corresponds to the same astigmatic spacing as above is attained at a magnification of 3570 or 14280, according as the incident angle $\alpha_2$ is equal to 4° or 1°. This fact shows that the confirmation of astigmatism can be made at a low magnification employed in the usual observation, and is a matter of especial importance from the practical point of view. Further, the Fresnel fringe method makes use of the Fresnel fringe caused by electron diffraction, and the material capable of generating the Fresnel fringe useful for the confirmation of astigmatism is limited to the collodion film or the like. On the other hand, in the case where the astigmatism is observed as the blur of an image in accordance with the present invention, any specimens which can be observed by an electron microscope, may be used to confirm the astigmatism. Accordingly, the confirmation of astigmatism can be made without changing a specimen, in a state that the usual observation by electron microscope is being made.

In order to make large in all directions the incident angle $\alpha_2$ of the electron beam incident upon the specimen 4, the incident azimuth of the electron beam is continuously changed. Therefore, when the astigmatism is present in the magnifying lens system, the image observed on the viewing screen 8 is vibrated in the direction of astigmatism. In fact, the amplitude of the vibration corresponds to the blur of image, and the number of vibrations depends upon the rotational frequency of the incident azimuth of the electron beam incident upon the specimen 4, namely, the rotational frequency of the rotating field. Experiments have shown that the vibrating image is observed as a stationary image at a frequency more than 20 Hz and the astigmatism is readily confirmed as compared with a case where the vibration is clearly observed. An upper limit of a frequency range for producing the stationary image is as follows. In a case where the first and second deflectors 9 and 10 are of an electromagnetic type, the counter electromotive force of each coil is large at high frequencies, and therefore a large power is required to generate the rotating field. For this reason, the upper limit of the frequency range is practically equal to about 1 kHz. However, in a case that the first and second deflectors 9 and 10 are of an electrostatic type, the rotational frequency of the rotating field (or the rotating electrostatic field) is not subject to restriction.

On the other hand, when the rotational frequency of the rotating field is less than 20 Hz, the vibration of the image in the direction of astigmatism is observed, and moreover the vibration becomes slow as the rotational frequency is lower, which makes it difficult to confirm the astigmatism. Experiments have shown that is very difficult to confirm the astigmatism at a rotational frequency less than 1 Hz.

The rotational frequency of the rotating field can be varied by changing both the frequency of the sine-wave alternating current generated by the sine-wave generator 111 and that of the current generated by the phase shifter 112, in interlocking relationship with each other.

The incident angle $\alpha_2$ of the electron beam incident upon the specimen 4 can be changed by changing the amplitude of the sine-wave alternating currents which are generated respectively by the sine-wave generator 111 and the phase shifter 112 and are different in phase from each other by 90°, that is, by changing the field strength of the combined magnetic field generated by each of the first and second deflectors 9 and 10 in an interlocked manner. The astigmatism is observed as a large blur of an image as the incident angle $\alpha_2$ is greater. Accordingly, when the path of the electron beam is wide, it is desirable to make the incident angle $\alpha_2$ as large as possible. In recent electron microscopes, however, the path of the electron beam is formed of a thin pipe in many cases. In such cases, the upper limit of the incident angle $\alpha_2$ is equal to about 4.5°, though this value varies a little according to the electron microscopes used.

In the above-mentioned embodiment, two deflectors are employed to continuously change the incident azimuth of the electron beam incident upon the specimen. Three deflectors or more may be employed. In this case, however, the construction becomes complicated. Accordingly, it is preferred to obtain the precession of the electron beam incident upon the specimen by two deflectors.

Further, in the above-mentioned embodiment, the coils making up the X-deflection system are arranged in such a manner that the magnetic flux passing through each of the coils is approximately perpendicular to the X-coordinate axis, and the coils making up the Y-deflection system are arranged so as to make the magnetic flux passing through each coil approximately perpendicular to the Y-coordinate axis. However, the coils of the X-deflection system may be arranged so as to make the magnetic flux passing through each coil parallel to the X-coordinate axis, and the coils of the Y-deflection system may be disposed so as to make the magnetic flux passing through each coil parallel to the Y-coordinate axis. The deflector of such a type has been known as the saddle-type deflector, in which the magnetic field indicated by the dotted line with an arrow on the X-coordinate axis is generated by the X-deflection system and the magnetic field indicated by the solid line with an arrow on the Y-coordinate axis is generated by the Y-deflection system. However, since the deflector of troidal type is smaller in size than the saddle-type deflector, the former is superior to the latter from the practical point of view.

Although the first and second deflectors each of an electromagnetic type are employed in the above-mentioned embodiment, these deflector may be of an electrostatic type. In this case, electrodes must be used in place of the coils. However, the deflector of an electrostatic type has a drawback that the voltage applied to the electrodes is apt to cause contamination on the electrodes. Therefore, it is preferred to employ the deflector of an electromagnetic type.

The phase shifter 112 employed in the above-mentioned embodiment may be replaced by a sine-wave generator capable of generating a sine-wave alternating current which is different in phase by 90° from the sine-wave alternating current generated by the sine-wave generator 111. In this case, the above two sine-wave generators have to be synchronized with each other so as to generate two sine-wave alternating currents having continuously a phase difference of 90° therebetween. Further, it is desired to be able to change the amplitude and the frequency of one of the sine-wave alternating current and those of the other current, in interlocking with each other.

Although only the sine-wave generator 111 is employed in the above-mentioned embodiment to supply the X-deflection system of the first and second deflectors with the sine-wave alternating currents, two sine-wave generators may be employed in order that one of the generators supplies the X-deflection system of the first deflector with a sine-wave alternating current and the other generator supplies the X-deflection system of the second deflector with another sine-wave alternating current. Similarly, two phase-shifters may be employed with respect to the Y-deflection system. In this case, however, the construction becomes complicated, and therefore is not economical.

The rotating field can be formed not only electrically but also mechanically. However, the rotating field mechanically formed is complicated in construction, large in size, and moreover has a relatively short life. Therefore, the rotating field electrically formed is preferred.

In the embodiment shown in FIG. 2, each of the first and second deflectors is provided with two pairs of coils arranged orthogonally, one of which is supplied with a sine-wave alternating current and the other pair is supplied with another sine-wave alternating current different in phase by 90° from the above current. That is, the deflector of two-phase system is employed. In the present invention, however, the deflector of three-phase system may be used which is provided with three coils arranged at angular intervals of 120°, and in which three sine-wave alternating currents different in phase by 120° from one another flow through the coils, respectively, because this deflector can generate a rotating field having a constant field strength. Now, let us consider a deflector in which three sine-wave alternating currents differing in phase by 120° from one another flow respectively through three coils arranged at angular intervals of 120°. In a case that a magnetic field $H_a$ ($=H_m \sin \omega t$) is formed on the positive side of the X-coordinate axis of the two-dimensional coordinate system in the direction leaving the origin of the coordinate system, that another magnetic field $H_b$ ($=H_m \sin (\omega t - 2/3\pi)$) having a direction leaving the origin is formed on a straight line which is obtained by clockwise rotating the X-coordinate axis about the origin by an angle of 120°, and that a further magnetic field $H_c$ ($=H_m \sin (\omega t - 4/3\pi)$) having a direction leaving the origin is formed on a straight line which is obtained by clockwise rotating the X-coordinate axis about the origin by an angle of 240°, the X- and Y-components $H_x$ and $H_y$ of the above magnetic fields are given by the following equations:

$$H_x = H_a + H_b \cos(-2/3\pi) + H_c \cos(-4/3\pi) = 3/2 H_m \sin \omega t,$$

$$H_y = H_b \sin(-2/3\pi) + H_c \sin(-4/3\pi) = 3/2 H_m \cos \omega t.$$

Accordingly, the combined magnetic field H becomes equal to $3/2\, H_m$, and therefore has a constant value. Further, since the angle $\theta$ between the combined magnetic field H and the X-coordinate axis is equal to $\pi/2 - \omega t$, the combined magnetic field H is rotated at an angular velocity of $\omega$. The fundamental construction of the three-phase deflector which has been explained above, is also applicable to the deflector of an electrostatic type. In either case, however, the three-phase deflector is complicated in construction, and high in cost. Therefore, the two-phase deflector is preferred.

In the foregoing description, the present invention has been explained in detail with reference to the preferred embodiment of the invention. However, it is to be understood that many modifications and variations of the present invention can be made without departing from the spirit and the scope of the invention.

We claim:

1. An electron microscope comprising means for generating an electron beam; means for causing the electron beam to impinge upon a specimen at a predetermined incident angle while continuously changing the incident azimuth of the electron beam incident upon the specimen at said predetermined incident angle at a predetermined frequency to transmit the electron beam through the specimen; a magnifying lens system for magnifying the transmitted electron beam in angular spread; and a viewing fluorescent screen for receiving the magnified electron beam projected thereon to form a visual enlarged image of the specimen on the viewing fluorescent screen wherein the beam is continuously rotated so that the resulting image on the viewing screen will be blurred in the direction of astigmatism.

2. An electron microscope according to claim 1, wherein said means for causing the electron beam to impinge upon the specimen comprises first and second deflection means operating in interlocking relationship with each other for deflecting the electron beam by a predetermined angle in opposite directions to each other while continuously changing the deflection azimuth of the electron beam as it impinges on said specimen.

3. An electron microscope according to claim 2, wherein said first deflection means comprises first magnetic field generating means for generating a first continuously-rotating magnetic field, and said second deflection means comprises second magnetic field generating means for generating a second continuously-rotating magnetic field whose direction is continuously opposite to that of the first rotating magnetic field.

4. An electron microscope according to claim 3, wherein said means for causing the electron beam to impinge upon the specimen further includes means for varying the first and second rotating magnetic fields in interlocking relationship with each other.

5. An electron microscope according to claim 1, wherein said means for causing said beam to impinge upon said specimen includes means for changing the incident azimuth of the electron beam incident upon the specimen at a predetermined frequency at which the visual enlarged image of the specimen is kept substantially stationary.

6. An electron microscope according to claim 3, wherein the first and second rotating magnetic fields have a rotational frequency at which the visual enlarged image of the specimen is kept substantially stationary.

7. An electron microscope according to claim 1, wherein said means for causing said beam to impinge upon said specimen includes means for changing the incident azimuth of the electron beam incident upon the specimen at a predetermined frequency within a range from 1 Hz to 1 kHz.

8. An electron microscope according to claim 3, wherein the first and second rotating magnetic fields have a rotational frequency within a range from 1 Hz to 1 kHz.

9. An electron microscope according to claim 1, wherein said means for causing said beam to impinge upon said specimen includes means for changing the incident azimuth of the electron beam incident upon the specimen at a predetermined frequency within a range from 20 Hz to 1 kHz.

10. An electron microscope according to claim 3, wherein the first and second rotating magnetic fields have a rotational frequency within a range from 20 Hz to 1 kHz.

11. An electron microscope according to claim 4, wherein the first and second rotating magnetic fields have a rotational frequency within a range from 20 Hz to 1 kHz.

12. An electron microscope comprising means for generating an electron beam along a predetermined axis; first deflection means for deflecting said electron beam away from said axis at a first predetermined angle; second deflecting means for deflecting said thus-deflected electron beam back to a location on said axis; holder means for holding a specimen at said location at which said beam is returned to said axis by said second deflecting means so that said electron beam is transmitted through said specimen at a predetermined incident angle; control means for controlling said first and second deflection means in a coordinate manner to effect continuous rotation of the deflection azimuth of the electron beam as it impinges on said specimen; a magnifying lens system for magnifying the transmitted electron beam in angular spread; and a viewing fluorescent screen for receiving the magnified electron beam projected thereon to produce a visual enlarged image of the specimen, wherein the beam is continuously rotated so that the resulting image on the viewing screen will be blurred in the direction of astigmatism.

13. An electron microscope according to claim 12, wherein said control means comprises means for applying to said first and second deflection means respective sinusoidal signals which are different in phase by 90° and whose frequency corresponds to the rate of rotation of said deflection azimuth.

14. An electron microscope according to claim 13, wherein said first and second deflection means each comprise an annular core having a plurality of windings disposed thereon for producing a composite magnetic field transverse to said axis in response to application thereto of said sinusoidal signals from said control means.

15. An electron microscope according to claim 14, wherein the windings on the core of said first deflection means are interconnected with the windings on the core of said second deflection means so that the composite magnetic fields generated by said first and second deflection means rotate at the same frequency and are continuously in opposite directions from each other.

16. An electron microscope according to claim 13, wherein the deflection azimuth of the electron beam is rotated at a predetermined frequency within a range of 1 Hz to 1 kHz.

17. An electron microscope according to claim 13, wherein the deflection azimuth of the electron beam is rotated at a predetermined frequency within a range of 20 Hz to 1 kHz.

18. An electron microscope according to claims 13 or 15, wherein said control means comprises a sine-wave generator for producing one of said sinusoidal signals and a phase shifter connected to said sine-wave generator for producing the other one of said sinusoidal signals.

19. In an electron microscope of the direct viewing type in which an electron beam is transmitted through a specimen, magnified in angular spread and projected onto a viewing screen, the improvement comprising means for deflecting said electron beam so that it impinges at a selected location on said specimen with a predetermined angle less than 90° and means for continuously rotating the incident azimuth of the electron beam at said location at a predetermined frequency so that the resulting image on the viewing screen will be blurred in the direction of astigmatism.

20. An electron microscope according to claim 19, wherein said predetermined frequency of rotation is within a range of 1 Hz to 1 kHz.

21. An electron microscope according to claim 19, wherein said predetermined frequency of rotation is within a range of 20 Hz to 1 kHz.

22. An electron microscope according to claim 19, wherein said deflecting means comprises means for simultaneously generating first and second magnetic fields in opposite directions at spaced points through which said electron beam is directed to travel.

23. An electron microscope according to claim 19, further including means for directing said electron beam along a path toward said specimen, said deflecting means including first and second magnetic cores disposed at spaced points along said path, each of said cores having at least first and second pairs of oppositely-disposed windings thereon for generating magnetic fields in orthogonal directions at the center of each core.

24. An electron microscope according to claim 23, wherein said rotating means comprises sine-wave generator means connected to said first pair of windings on said first and second magnetic cores and cosine-wave generator means synchronized with said sine-wave generator means and connected to said second pair of windings on said first and second magnetic cores.

* * * * *